United States Patent
Pai et al.

(10) Patent No.: US 8,498,091 B2
(45) Date of Patent: Jul. 30, 2013

(54) ANTISTATIC DEVICE ASSEMBLY

(75) Inventors: Yu-Chang Pai, New Taipei (TW);
Shen-Chun Li, New Taipei (TW);
Hsien-Chuan Liang, Taipei (TW)

(73) Assignee: Hon Hai Precision Industry Co., Ltd., New Taipei (TW)

( * ) Notice: Subject to any disclaimer, the term of this patent is extended or adjusted under 35 U.S.C. 154(b) by 37 days.

(21) Appl. No.: 13/236,658

(22) Filed: Sep. 20, 2011

(65) Prior Publication Data

US 2012/0327550 A1    Dec. 27, 2012

(30) Foreign Application Priority Data

Jun. 23, 2011   (TW) .............................. 100121929 A

(51) Int. Cl.
*H05F 3/02*    (2006.01)
(52) U.S. Cl.
USPC ........................................................ 361/220
(58) Field of Classification Search
USPC ........................................................ 361/220
See application file for complete search history.

(56) References Cited

U.S. PATENT DOCUMENTS

| | | | | |
|---|---|---|---|---|
| 3,898,526 A | * | 8/1975 | Hendricks | 361/222 |
| 4,553,191 A | * | 11/1985 | Franks et al. | 361/212 |
| 4,654,746 A | * | 3/1987 | Lewis et al. | 361/212 |
| 5,168,431 A | * | 12/1992 | Moulton et al. | 361/797 |
| 6,674,630 B1 | * | 1/2004 | Gefter et al. | 361/212 |
| 7,184,255 B2 | * | 2/2007 | Chen | 361/220 |

* cited by examiner

*Primary Examiner* — Jared Fureman
*Assistant Examiner* — Kevin J Comber
(74) *Attorney, Agent, or Firm* — Altis Law Group, Inc.

(57) ABSTRACT

An exemplary antistatic device assembly includes an electricity receiving part and an electricity discharging part. Guiding portions protrude from the electricity receiving part. The electricity discharging part is located at a side of the electricity receiving part, and oriented toward and spaced from the guiding portions of the electricity receiving part. The electricity discharging part is electrically conductive and capable of being grounded. Static electricity accumulated on the electricity receiving part is removable to the electricity discharging part via the guiding portions.

12 Claims, 5 Drawing Sheets

ANTISTATIC DEVICE ASSEMBLY

BACKGROUND

1. Technical Field

The present disclosure relates to antistatic device assemblies, and particularly to an antistatic device assembly used for protecting electronic devices.

2. Description of Related Art

With the continuing development of electronics technology, a multiplicity of precision devices are used in various fields of industry. In general, electronic precision devices are prone to be damaged or destroyed by static electricity. Typically, static electricity accumulated on a precision device is removed by a grounded wire connected to the precision device. However, in some instances, the electric potential of the ground is not stable. In addition, in certain cases such as when lightning strikes, electrical current may even reversely flow to the precision device. Thus, some precision devices are still at risk even when they are grounded.

What is needed, therefore, is an antistatic device assembly which can overcome the described limitations.

DETAILED DESCRIPTION

Figure 1:
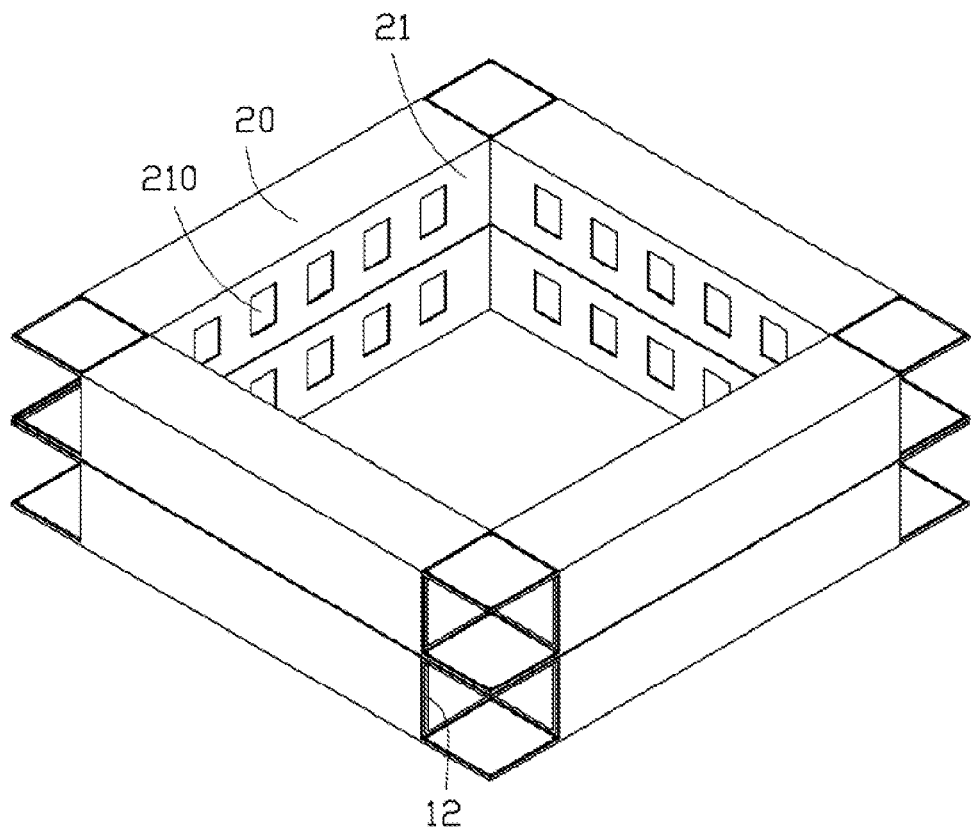
FIG. 1 is a schematic view of an arrangement of an antistatic device assembly according to an embodiment of the present disclosure, wherein the antistatic device assembly has a plurality of antistatic devices which are supported by a supporting member.
Figure 2:
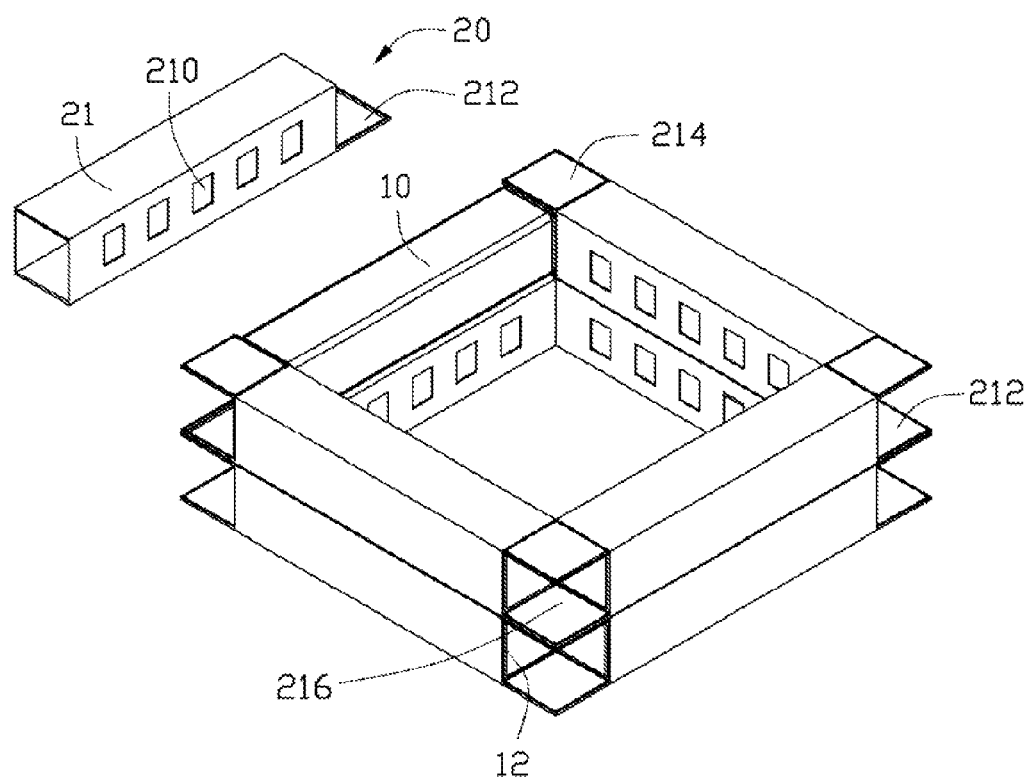
FIG. 2 is similar to FIG. 1, but showing one supporting part of the supporting member disassembled from a corresponding one of the antistatic devices of the antistatic device assembly.

Referring to FIGS. 1-2, a plurality of antistatic devices 10 of an antistatic device assembly are supported by a supporting member. The supporting member includes a plurality of separate supporting parts 20. In this embodiment, each of the supporting parts 20 is hollow, and includes four elongated rectangular sidewalls 21 connected together and cooperatively defining a rectangular chamber. Each supporting part 20 is electrically insulative. A plurality of openings 210 are defined in one of the sidewalls 21. The openings 210 are aligned with each other along a longitudinal direction of the sidewall 21. A rectangular extending plate 212 integrally extends coplanarly and outwardly from an end of one of the sidewalls 21.

Four of the supporting parts 20 are arranged end to end and interconnected with each other to cooperatively form a hollow, rectangular frame. In particular, an end of each supporting part 20 not having the extending plate 212 is arranged perpendicularly adjacent to the end of another supporting part 20 having the extending plate 212. Thereby, corresponding sidewalls 21 (having the openings 210) of the adjacent supporting parts 20 are connected end to end. The extending plates 212 are located at four corners of the frame, at bottom sides of the corners, respectively. Four square covering plates 214 are located at the four corners of the frame, at top sides of the frame, respectively. Each covering plate 214 interconnects ends of two sidewalls 21 located at the top side of the frame. Each covering plate 214 faces a corresponding extending plate 212. The covering plate 214 and the corresponding extending plate 212 cooperatively define a receiving space 216 therebetween to receive other elements therein.

If a large number of the antistatic devices 10 is required, more than one frame of the interconnected supporting parts 20 can be provided. If a plurality of frames is provided, the frames can be stacked one on the other. FIG. 1 shows two frames of the interconnected supporting parts 20 stacked together. That is, in the illustrated embodiment, the supporting member comprises two frames of the interconnected supporting parts 20 stacked together.

Each antistatic device 10 is received in a respective one of the supporting parts 20, and contacts objects (not shown) inserted through the openings 210.

Figure 3:
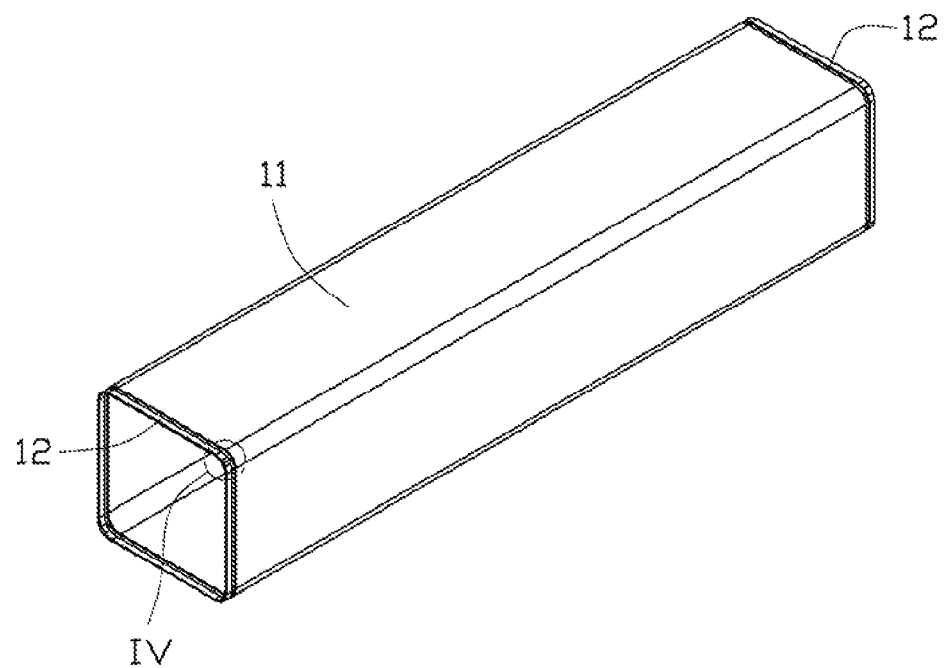
FIG. 3 is an isometric view of the antistatic device of FIG. 2.
Figure 4:
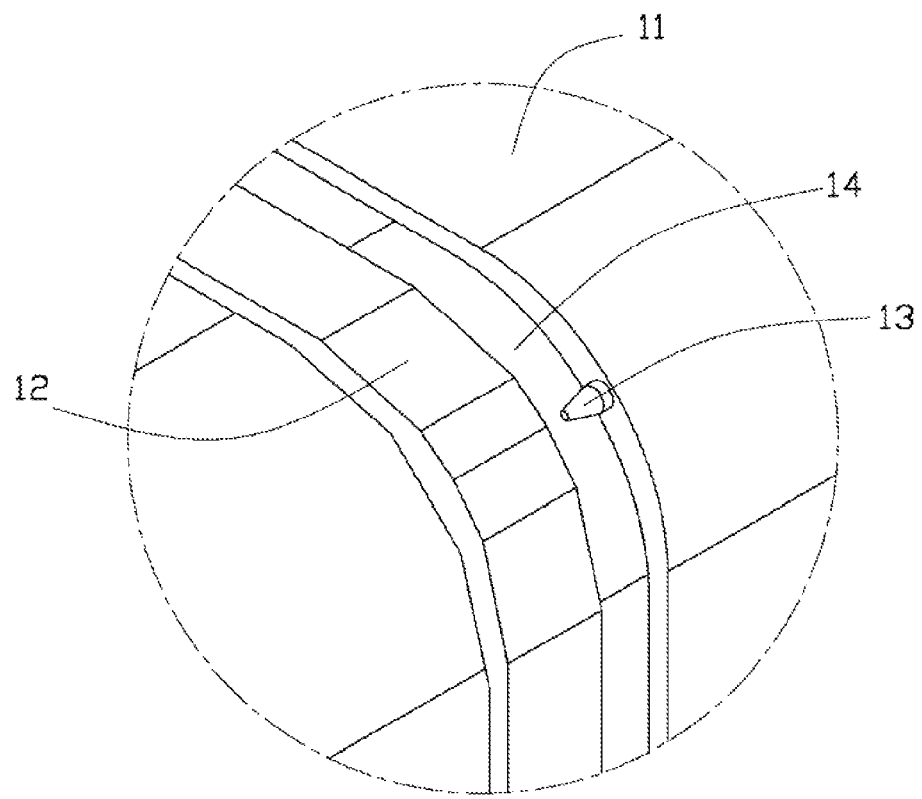
FIG. 4 is an enlarged view of a circled part IV of the antistatic device of FIG. 3.

Referring also to FIGS. 3-4, each of the antistatic devices 10 includes a hollow, rectangularly cylindrical electricity receiving part 11, and two rectangularly annular electricity discharging parts 12 formed at opposite ends of the electricity receiving part 11, respectively. In the present embodiment, the electricity receiving part 11 is in the shape of a hollow, square cylinder, and each electricity discharging part 12 is in the shape of a square annulus. The electricity receiving part 11 is made of a metallic sheet which is pre-charged with positive charge. Preferably, the electricity receiving part 11 is made of one of brass and copper. A size of the electricity receiving part 11 approaches that of the four sidewalls 21 of the corresponding supporting part 20. That is, the electricity receiving part 11 is slightly smaller than the combination of the four sidewalls 21. A plurality of guiding portions 13 protrudes from each of opposite ends of the electricity receiving part 11, toward the corresponding electricity discharging part 12. Each guiding portion 13 is tapered, and comprises a first end connected to the electricity receiving part 11 and a second end opposite from the first end. A diameter of the guiding portion 13 generally decreases from the first end to the second end. The guiding portion 13 can for example be substantially frustoconical or substantially pyramidal. The second ends of the guiding portions 13 are spaced from the corresponding electricity discharging parts 12.

Each electricity discharging part 12 corresponds to one of the ends of the respective electricity receiving part 11. The electricity discharging part 12 is electrically conductive and grounded (earthed). The electricity discharging parts 12 are arranged at the opposite ends of the electricity receiving part 11, and fixed on an inner surface of the supporting part 20 (as shown in FIGS. 1-2). A narrow space 14 is defined between the second end of the guiding portion 13 and the electricity discharging part 12. Therefore, the electricity discharging part 12 is away from the electricity receiving part 11 to avoid electrical current of ground reflowing to the electricity receiving part 11. The static electricity accumulated on the electricity receiving part 11 is removed to the electricity discharging parts 12 by the guiding portions 13 and then removed to ground from the electricity discharging parts 12.

Figure 5:
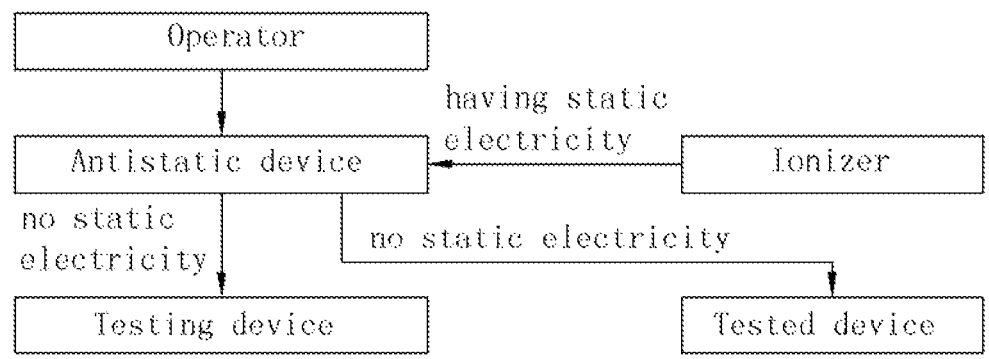
FIG. 5 is a flowchart of a method for using the antistatic device to remove static electricity of a human and of device elements of a testing system.

Referring also to FIG. 5, in a typical application, the antistatic device 10 is utilized to remove static electricity of an electronic testing system. The testing system includes a tested device (i.e., a device under test) and a testing device. A human operator handles the testing system. Generally, the tested device is a precision device. In this embodiment, the tested device is a high frequency oscillograph. The operator runs the testing device to test one or more parameters of the tested device. A method of removing static electricity of the testing system utilizing the antistatic device 10 includes the following steps:

The first step is providing the antistatic device 10 and the corresponding supporting part 20. The antistatic device 10 is received in the supporting part 20, and the electricity discharging parts 12 are grounded.

The second step is the operator contacting the antistatic device 10 through one of the openings 210 of the sidewall 21 of the supporting part 20 to remove any static electricity accumulated on the operator.

The third step is the operator operating the testing device and the tested device in turn to make the testing device and the tested device contact the antistatic device 10 through one of the openings 210, thereby removing any static electricity thereof. In this state, any and all static electricity of the operator, the testing device and the tested device are removed by the antistatic device 10. Accordingly, the tested device avoids being damaged or destroyed by static electricity of the testing device and/or the operator.

In addition, an ionizer (blower) and a static electricity testing device are provided. After the operator, the testing device or the tested device contacts the antistatic device 10, the electricity static testing device can test for the amount of static electricity present on the antistatic device 10. If some static electricity remains on the antistatic device 10, the ionizer blows a mixture of positive ions and negative ions onto the antistatic device 10 to neutralize the static electricity of the antistatic device 10.

It is to be understood, however, that even though numerous characteristics and advantages of the embodiments have been set forth in the foregoing description, together with details of the structures and functions of the embodiments, the disclosure is illustrative only, and changes may be made in detail, especially in matters of shape, size, and arrangement of parts within the principles of the disclosure to the full extent indicated by the broad general meaning of the terms in which the appended claims are expressed.

What is claimed is:

1. An antistatic device assembly comprising:
a hollow frame cooperatively comprised of four electrically insulative supporting parts arranged end to end and interconnected with each other; and
four antistatic devices received in the four supporting parts, respectively, each antistatic device comprising:
an electricity receiving part adapted for receiving static electricity of objects, a plurality of guiding portions protruding from the electricity receiving part; and
an electricity discharging part, the electricity discharging part located at a side of the electricity receiving part, fixed on the corresponding supporting part, and oriented toward and spaced from the guiding portions of the electricity receiving part, and the electricity discharging part being electrically conductive and capable of being grounded;
wherein a plurality of openings is defined in each supporting part to expose portions of the corresponding electricity receiving part; and
wherein for each antistatic device, static electricity accumulated on the electricity receiving part is removable to the electricity discharging part via the guiding portions.

2. The antistatic device assembly of claim 1, wherein each electricity receiving part is a hollow tube and the guiding portions are formed on at least one end of the hollow tube.

3. The antistatic device assembly of claim 1, wherein each electricity receiving part is pre-charged with positive charge.

4. The antistatic device assembly of claim 1, wherein each electricity receiving part is made of one of brass and copper.

5. The antistatic device assembly of claim 2, wherein each antistatic device further comprises another electricity discharging part, wherein the guiding portions are formed on opposite ends of the hollow tube, and the two electricity discharging parts are respectively arranged at the opposite ends of the hollow tube.

6. The antistatic device assembly of claim 2, wherein each of the guiding portions is tapered, and a diameter of the guiding portion generally decreases from an end thereof connected to the electricity receiving part to an opposite end thereof away from the electricity receiving part.

7. The antistatic device assembly of claim 1, wherein an extending plate integrally extends outwardly from an end of each of the supporting parts, and an end of each of the supporting parts not having the extending plate is arranged perpendicularly adjacent to the end of another supporting part having the extending plate.

8. The antistatic device assembly of claim 7, wherein each of the supporting parts comprises four elongated rectangular sidewalls connected together and cooperatively defining a rectangular chamber, and the extending plate extends from one of the sidewalls and is coplanar with that sidewall.

9. The antistatic device assembly of claim 8, wherein the extending plates are located at four corners of the frame, at bottom sides of the corners, respectively.

10. The antistatic device assembly of claim 9, further comprising four covering plates located at four corners of the frame, at top sides of the corners, respectively, wherein each covering plate faces a corresponding extending plate, and the covering plate and the extending plate cooperatively define a receiving space therebetween.

11. The antistatic device assembly of claim 10, wherein each covering plate interconnects ends of two corresponding sidewalls located at the top side of the frame.

12. The antistatic device assembly of claim 11, further comprising another hollow frame, wherein the two frames are stacked one on the other.

* * * * *